(12) United States Patent
Duzly et al.

(10) Patent No.: US 8,817,569 B2
(45) Date of Patent: Aug. 26, 2014

(54) IMMUNITY AGAINST TEMPORARY AND SHORT POWER DROPS IN NON-VOLATILE MEMORY

(71) Applicant: SanDisk Technologies Inc., Plano, TX (US)

(72) Inventors: Yacov Duzly, Raanana (IL); Alon Marcu, Tel-Mond (IL); Farookh Moogat, Fremont, CA (US); Yan Li, Milpitas, CA (US); Aaron Keith Olbrich, Morgan Hill, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/803,835

(22) Filed: Mar. 14, 2013

(65) Prior Publication Data
US 2013/0265841 A1    Oct. 10, 2013

Related U.S. Application Data

(60) Provisional application No. 61/612,540, filed on Mar. 19, 2012.

(51) Int. Cl.
| | |
|---|---|
| *G11C 5/14* | (2006.01) |
| *G11C 7/22* | (2006.01) |
| *G11C 16/30* | (2006.01) |
| *G11C 16/32* | (2006.01) |
| G11C 16/04 | (2006.01) |
| G11C 11/56 | (2006.01) |

(52) U.S. Cl.
CPC *G11C 7/222* (2013.01); *G11C 5/14* (2013.01); *G11C 16/0483* (2013.01); *G11C 5/143* (2013.01); *G11C 11/5628* (2013.01); *G11C 11/5642* (2013.01); *G11C 16/30* (2013.01); *G11C 16/32* (2013.01)
USPC ........................................................ 365/228

(58) Field of Classification Search
CPC ........................................................ G11C 5/14
USPC ............................ 365/226–229, 189.09, 154
See application file for complete search history.

(56) References Cited

U.S. PATENT DOCUMENTS

| | | | |
|---|---|---|---|
| 5,070,032 A | 12/1991 | Yuan et al. | |
| 5,079,744 A * | 1/1992 | Tobita et al. | 365/201 |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Harry W Byrne
(74) *Attorney, Agent, or Firm* — Davis Wright Tremaine LLP

(57) ABSTRACT

A mechanism is presented memory circuits, such a NAND-type flash memories, to autonomously protect themselves from temporary and short power drops. A detection mechanism looks for the supply voltage to drop below a function voltage for a period of time. When such an event occurs, a suspend mechanism is activated, and after completing the last micro-operation (such as a program pulse) the memory freezes. When power is again stable at an operational level, the suspended operation is resumed. The memory controller can then be notified upon occurrence of such voltage drop by polling a special status bit. Examples of how the pausing can be implemented include altering of clock signals and suspending sub-phases of larger operations.

21 Claims, 14 Drawing Sheets

(56) References Cited

U.S. PATENT DOCUMENTS

| | | |
|---|---|---|
| 5,095,344 A | 3/1992 | Harari |
| 5,172,338 A | 12/1992 | Mehrotra et al. |
| 5,313,421 A | 5/1994 | Guterman et al. |
| 5,315,541 A | 5/1994 | Harari et al. |
| 5,343,063 A | 8/1994 | Yuan et al. |
| 5,500,823 A * | 3/1996 | Martin et al. ............ 365/201 |
| 5,570,315 A | 10/1996 | Tanaka et al. |
| 5,661,053 A | 8/1997 | Yuan |
| 5,768,192 A | 6/1998 | Eitan |
| 5,903,495 A | 5/1999 | Takeuchi et al. |
| 6,011,725 A | 1/2000 | Eitan |
| 6,046,935 A | 4/2000 | Takeuchi et al. |
| 6,222,762 B1 | 4/2001 | Guterman et al. |
| 7,206,230 B2 | 4/2007 | Li et al. |
| 7,283,410 B2 * | 10/2007 | Hsu et al. ............ 365/201 |
| 8,111,577 B2 * | 2/2012 | Sheets et al. ............ 365/228 |
| 2006/0140007 A1 | 6/2006 | Cernea et al. |
| 2009/0089481 A1 | 4/2009 | Kapoor et al. |
| 2012/0167100 A1 | 6/2012 | Li |

OTHER PUBLICATIONS

U.S. Appl. No. 13/411,115, entitled "Saving of Data in Cases of Word-Line to Word-Line Short in Memory Arrays," filed Mar. 2, 2012, 82 pages.

U.S. Appl. No. 13/471,198, entitled "Memory Chip Power Management," filed May 14, 2012, 29 pages.

U.S. Appl. No. 13/559,377, entitled "Non-Volatile Memory and Method with Peak Current," filed Jul. 26, 2012, 31 pages.

U.S. Appl. No. 13/803,835 entitled "Immunity Against Temporary and Short Power Drops in Non-Volatile Memory," filed Mar. 14, 2013, 44 pages.

* cited by examiner

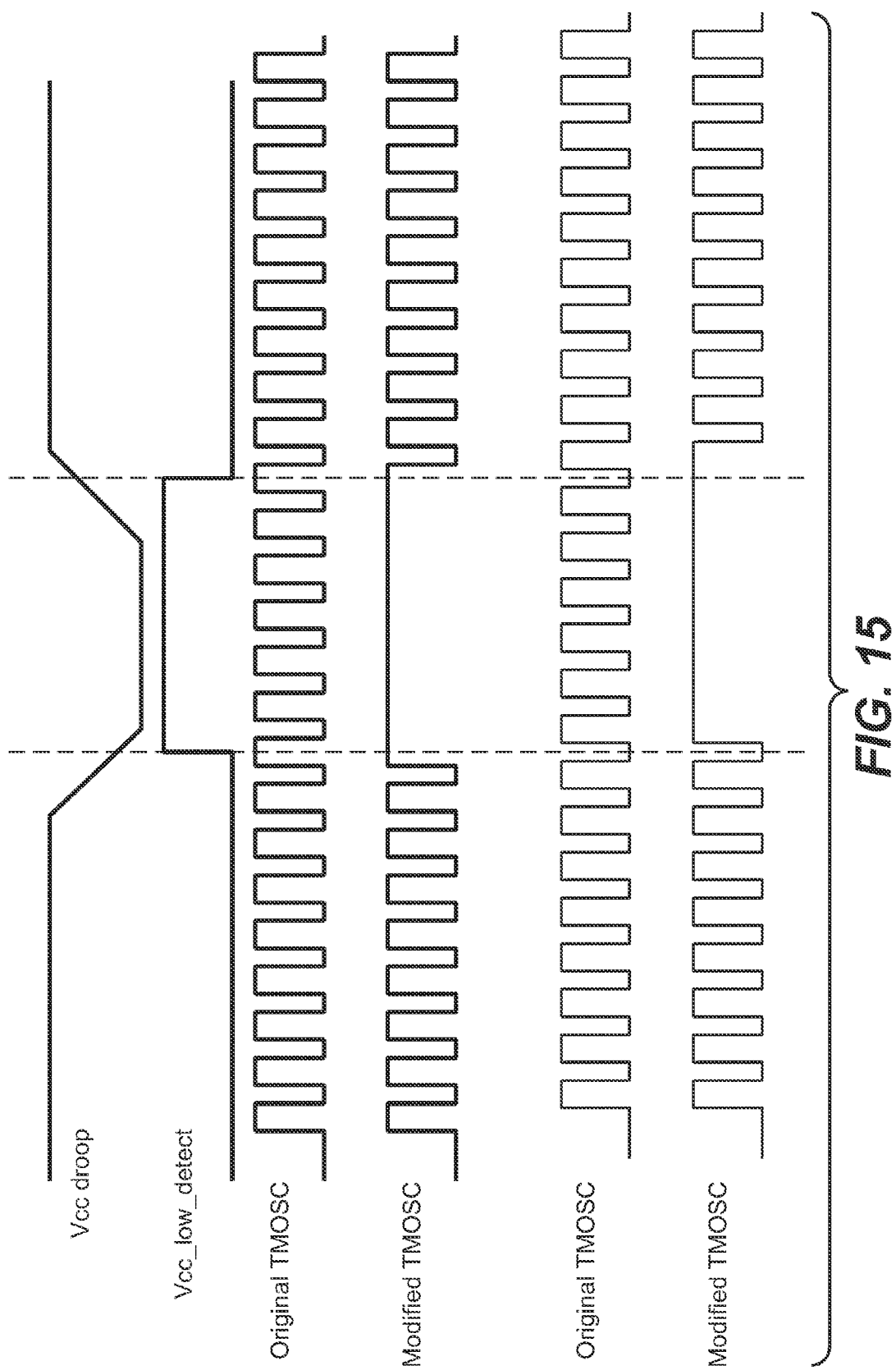

IMMUNITY AGAINST TEMPORARY AND SHORT POWER DROPS IN NON-VOLATILE MEMORY

CROSS-REFERENCE TO RELATED APPLICATION

This application claims priority from U.S. Provisional Application No. 61/612,540, filed on Mar. 19, 2012, is related to a concurrently filed application Ser. No. 13/803,882 entitled "Immunity Against Temporary and Short Power Drops in Non-Volatile Memory Pausing Techniques" by Yan Li, which are hereby incorporated in its entirety by this reference.

FIELD OF THE INVENTION

This invention relates generally to non-volatile semiconductor memory such as electrically erasable programmable read-only memory (EEPROM) and flash EEPROM, and specifically to techniques of dealing with power level fluctuation.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Non-volatile memory devices receive their power from the host. The memory device is designed to operate within a standard power specification. There may be occasions when the memory's voltage from the power supply drops below the specification values or when the voltage level drops due to internal power use. This can result in loss of data and, in some cases, damage to the internal databases, possibly even leading to the failure of storage device initialization. Consequently, there is a need to protect memory devices against such power drops.

SUMMARY OF INVENTION

A mechanism is presented memory circuits, such a NAND-type flash memories, to autonomously protect themselves from temporary and short power drops. A detection mechanism looks for the supply voltage to drop below a functional voltage for a period of time. When such an event occurs, a suspend mechanism is activated, and after completing the last micro-operation (such as a program pulse) the memory freezes. When power is again stable at an operational level, the suspended operation is resumed. The memory controller can then be notified upon occurrence of such voltage drop by polling a special status bit.

A first set of aspects relates to a method of operating a non-volatile memory circuit connected to receive a supply voltage for use in the operations it performs. The method includes monitoring by the memory circuit of the voltage level of the voltage supply and, while monitoring the voltage level of the voltage supply, determining whether the voltage level of the supply voltage has dropped below a first voltage level for a first amount of time. In response to determining that the voltage level has dropped below the first voltage level for the first amount of time, a command is issued to place an operation on the memory circuit into a suspended state. The memory circuit subsequently continues to monitor the voltage level of the voltage supply and, while the operation on the memory circuit is in a suspended state, determines whether the voltage level of the supply voltage risen above a second voltage level for a second amount of time. In response to determining that the voltage level has risen above the second voltage level for the second amount of time, a command is issued to resume the operation placed in a suspended state and the resumed operation is completing. In some embodiments, the resume operation can be done using a parameter controlled time, where, in multi-chip systems, each chip can be resumed at different time according to a random timer.

Other aspects relate to a method of operating a non-volatile memory circuit, where the method includes receiving a command to pause an operation and, in response to the command, altering the frequency of a clock signal used in performing the operation on the non-volatile memory circuit. The frequency of the clock signal is restored in response to subsequently receiving a command to resume said operation. in some embodiments, the frequency of the operation clock can also be resumed to normal frequency when the supply voltage is resumed to normal level. The frequency can be generated by a voltage controlled oscillator, for example Further aspect relating to methods of operating a non-volatile memory circuit include receiving a pause command while performing a first operation having multiple sub-phases. In response to the pause command, it is determined whether the sub-phase of the first operation being executed is pausable: in response to determining the sub-phase being executed is pausable, the pause command is executed; and in response to determining the sub-phase being executed is not pausable, executing the pause command is delayed.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 15 illustrates altering of a clock signal to effect a pause.

DESCRIPTION OF THE PREFERRED EMBODIMENTS

Memory System

FIG. 1 to FIG. 11 illustrate example memory systems in which the various aspects of the present invention may be implemented.

Figure 1:
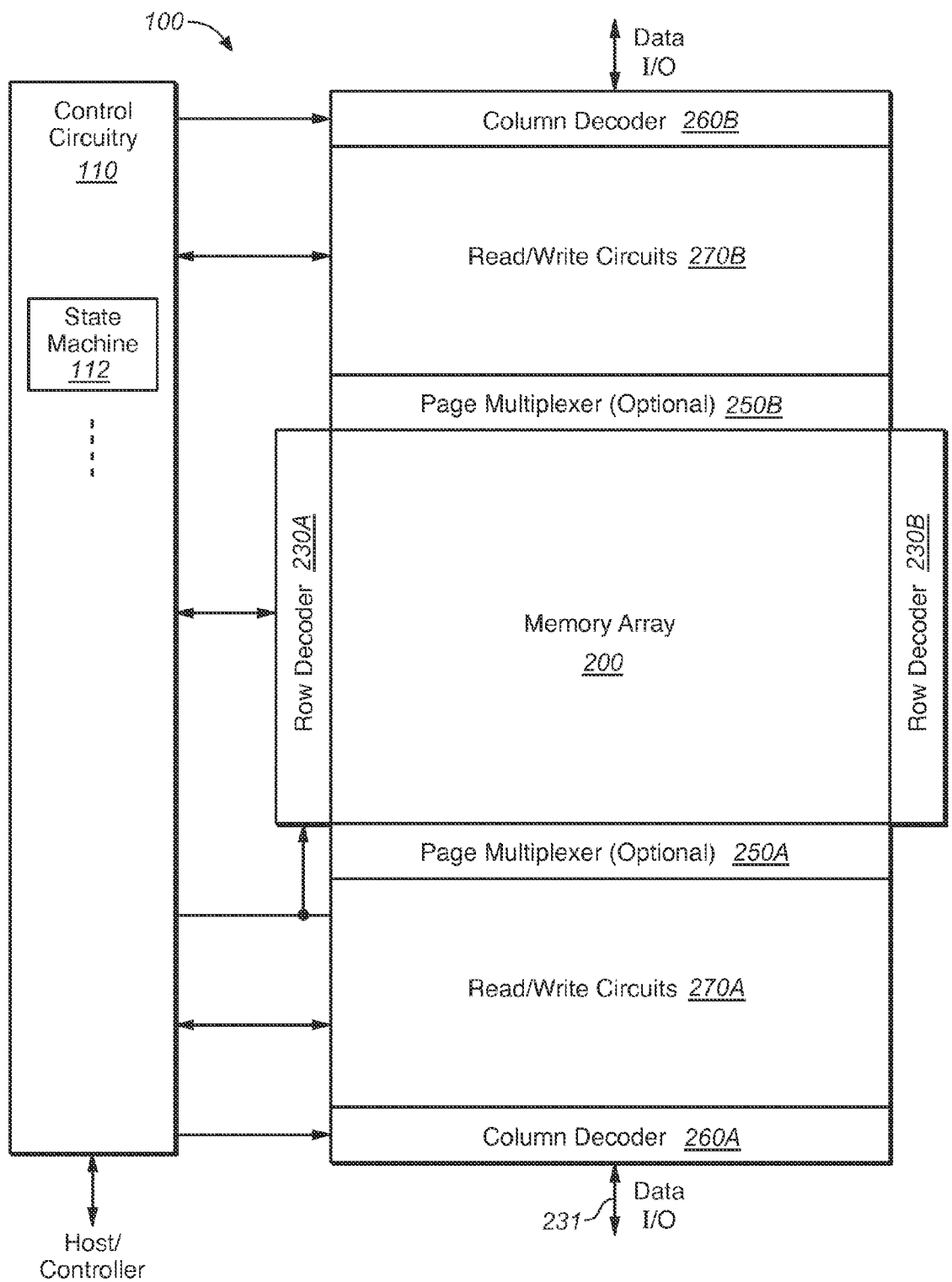
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
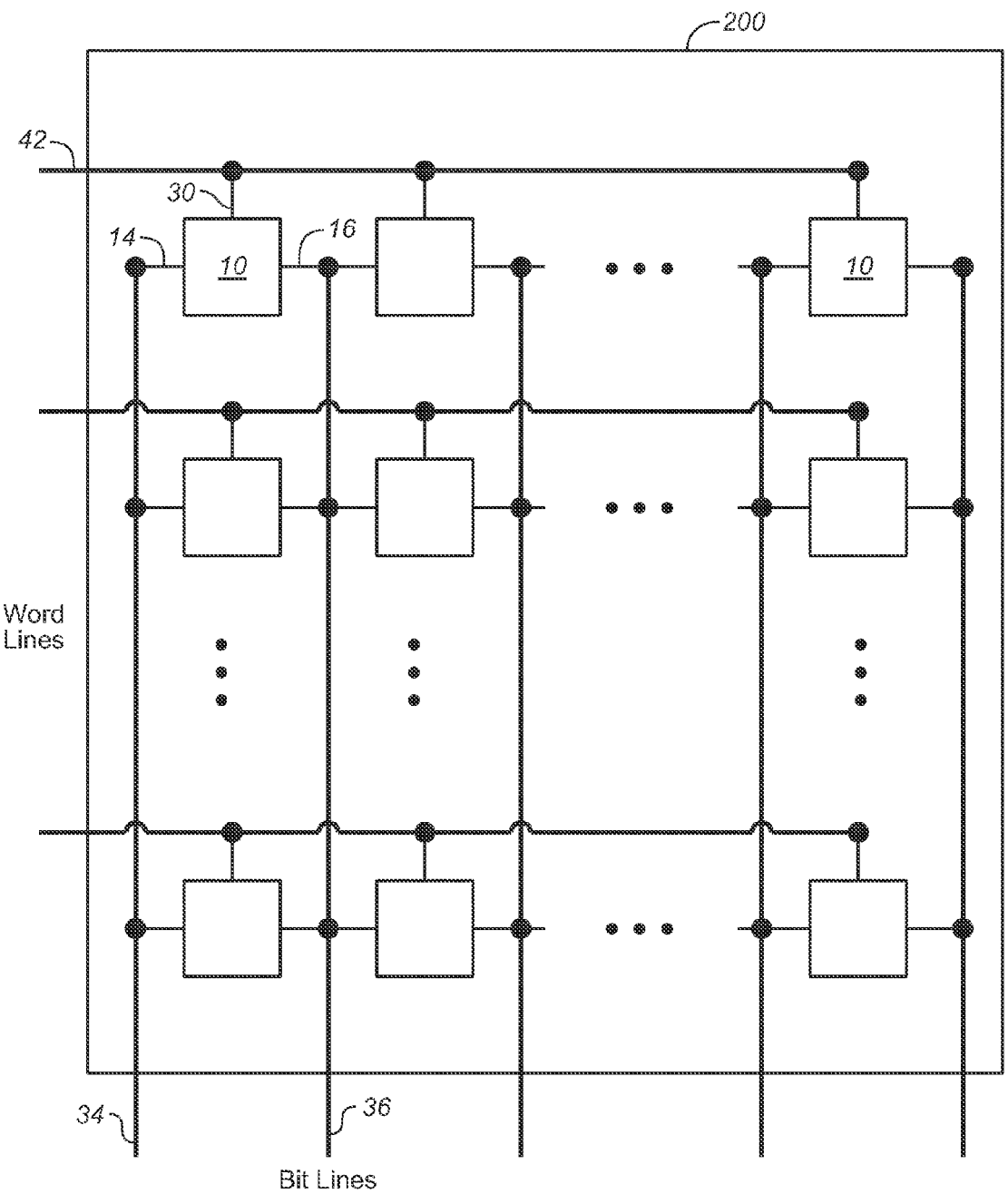
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
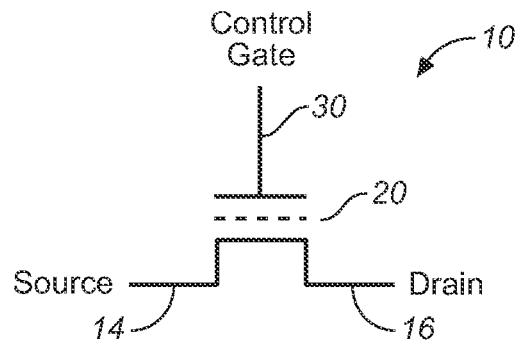
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
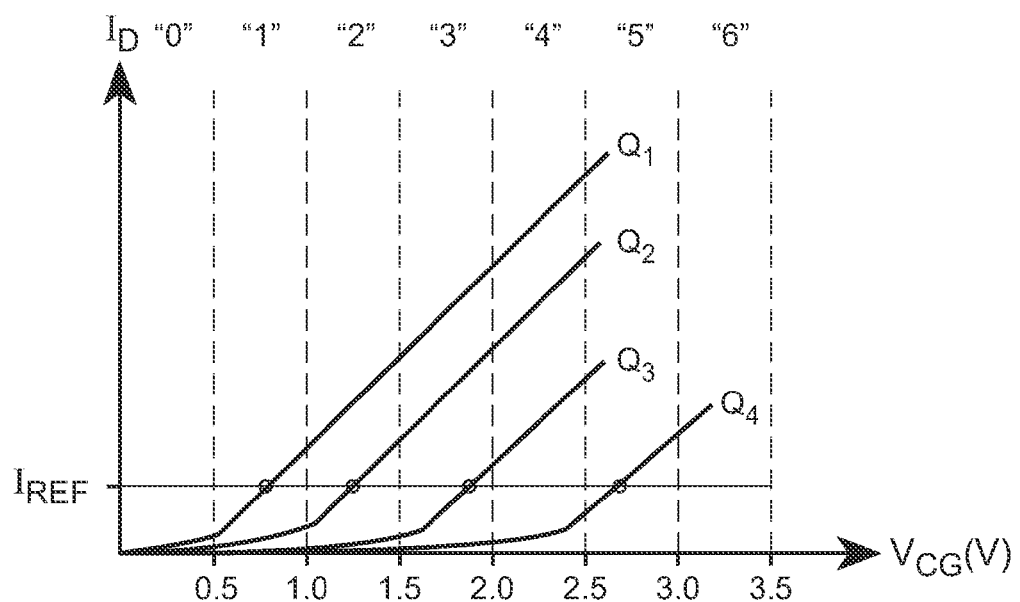
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
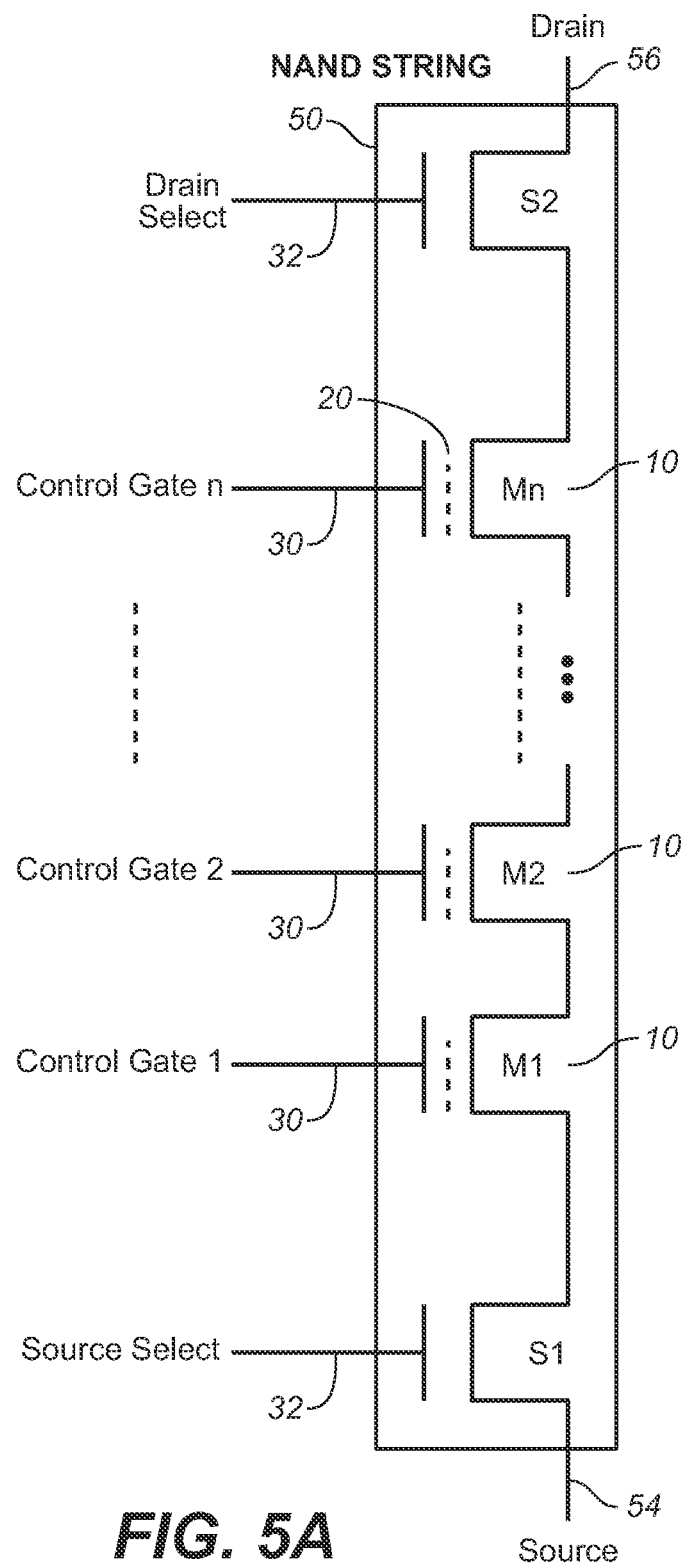
FIG. 5A illustrates schematically a string of memory cells organized into an NAND string.

FIG. 5A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
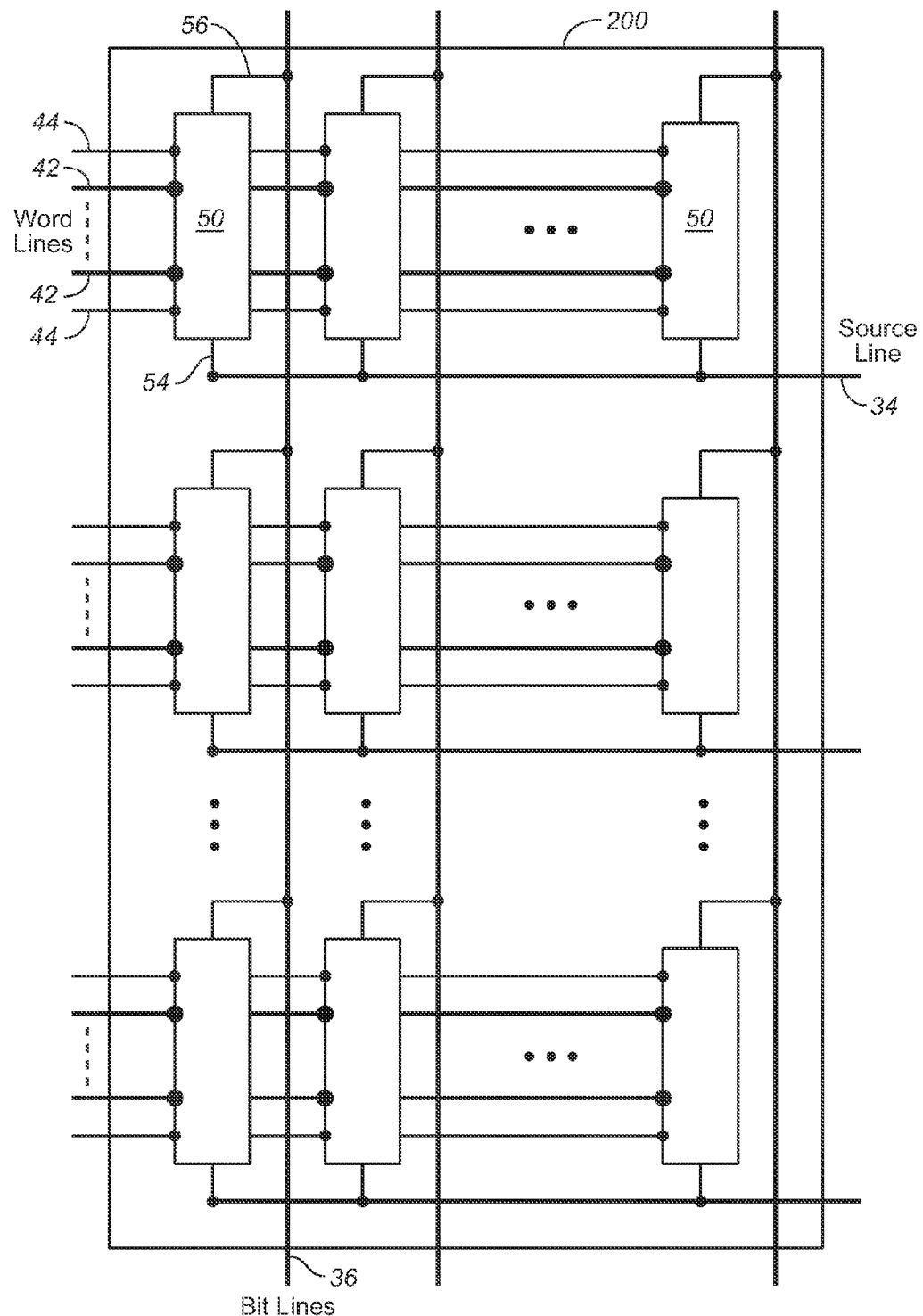
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Sensing Circuits and Techniques

Figure 6:
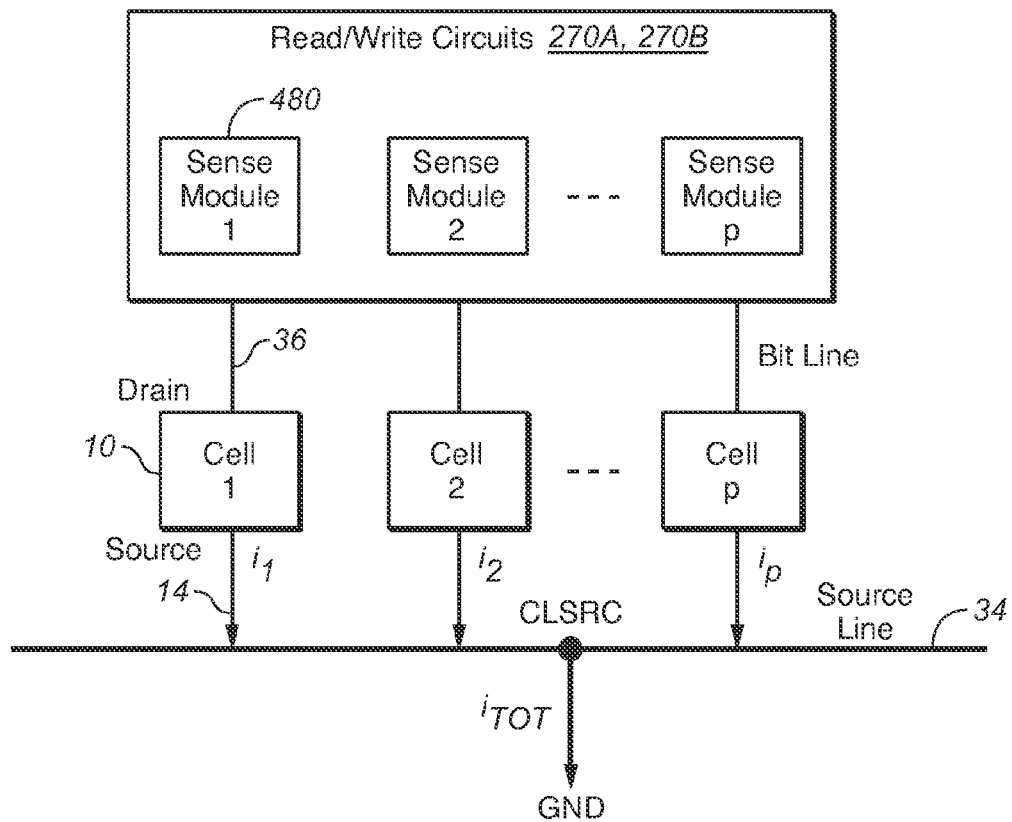
FIG. 6 illustrates the Read/Write Circuits 270A and 270B, shown in FIG. 1, containing a bank of p sense modules across an array of memory cells.

FIG. 6 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit×4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 7:
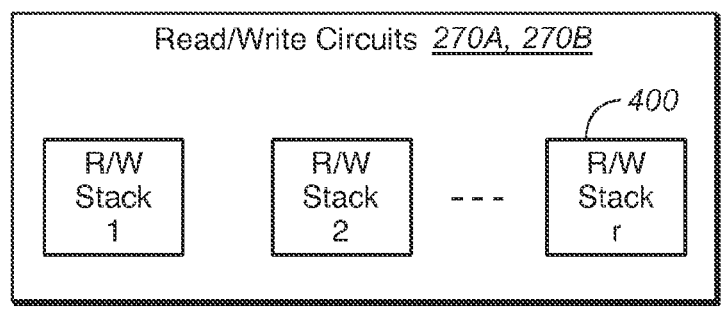
FIG. 7 illustrates schematically a preferred organization of the sense modules shown in FIG. 6.

FIG. 7 illustrates schematically a preferred organization of the sense modules shown in FIG. 6. The read/write circuits 270A and 270B containing p sense modules are grouped into a bank of read/write stacks 400.

Figure 8:
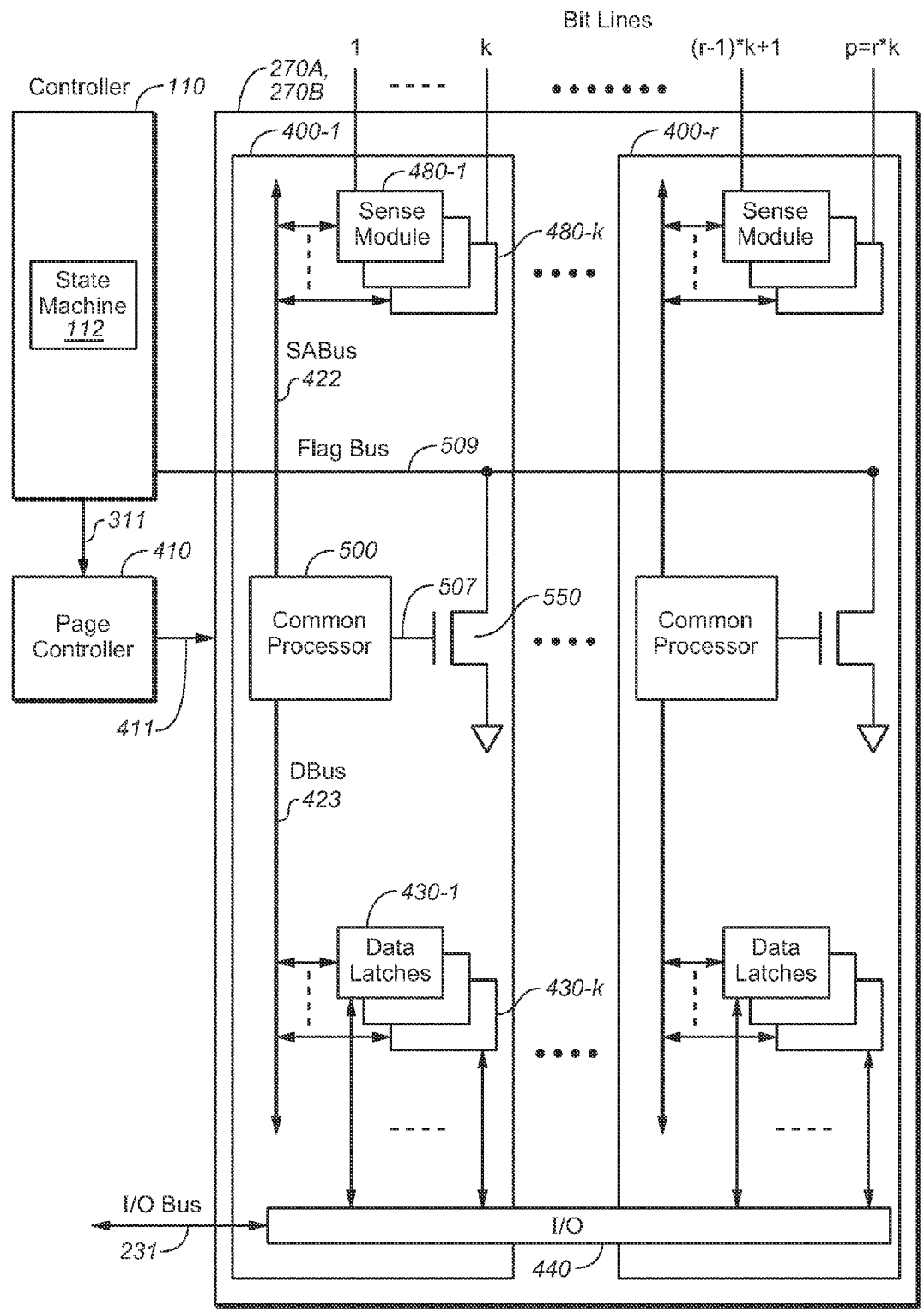
FIG. 8 illustrates in more detail the read/write stacks shown in FIG. 7.

FIG. 8 illustrates in more detail the read/write stacks shown in FIG. 7. Each read/write stack 400 operates on a group of k bit lines in parallel. If a page has p=r*k bit lines, there will be r read/write stacks, 400-1, . . . , 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. Patent Application Publication Number: US-2006-0140007-A1 on Jun. 29, 2006, the entire disclosure of which is incorporated herein by reference.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the preferred arrangement, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to 430-k, one for each memory cell associated with the stack. The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

More detail on data latch structures is presented in U.S. Pat. Nos. 7,206,230 and 8,102,705. More detail on latch structures can also be found in U.S. patent application Ser. No. 12/978,001, which is incorporated by reference both its general discuss and for how data latches and other memory elements are treated in response to a suspend.

Examples of Multi-State Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data.

Figure 9:
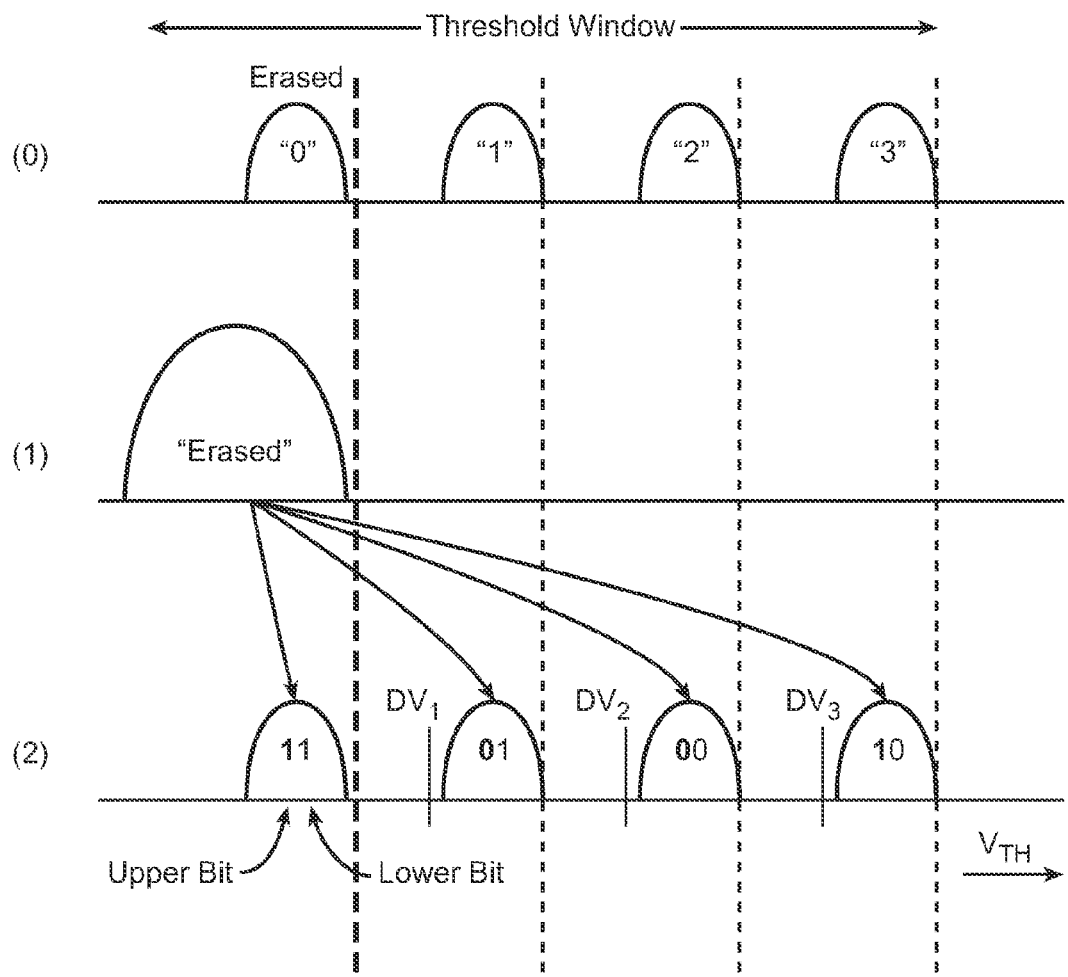
FIGS. 9(0)-9(2) illustrate an example of programming a population of 4-state memory cells.

FIGS. 9(0)-9(2) illustrate an example of programming a population of 4-state memory cells. FIG. 9(0) illustrates the population of memory cells programmable into four distinct distributions of threshold voltages respectively representing memory states "0", "1", "2" and "3". FIG. 9(1) illustrates the initial distribution of "erased" threshold voltages for an erased memory. FIG. 9(2) illustrates an example of the memory after many of the memory cells have been programmed. Essentially, a cell initially has an "erased" threshold voltage and programming will move it to a higher value into one of the three zones demarcated by $DV_1$, $DV_2$ and $DV_3$. In this way, each memory cell can be programmed to one of the three programmed state "1", "2" and "3" or remain un-programmed in the "erased" state. As the memory gets more programming, the initial distribution of the "erased" state as shown in FIG. 9(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and "10". The 2-bit data may be read from the memory by sensing in "full-sequence" mode where the two bits are sensed together by sensing relative to the read demarcation threshold values $DV_1$, $DV_2$ and $DV_3$ in three sub-passes respectively.

Figure 10:
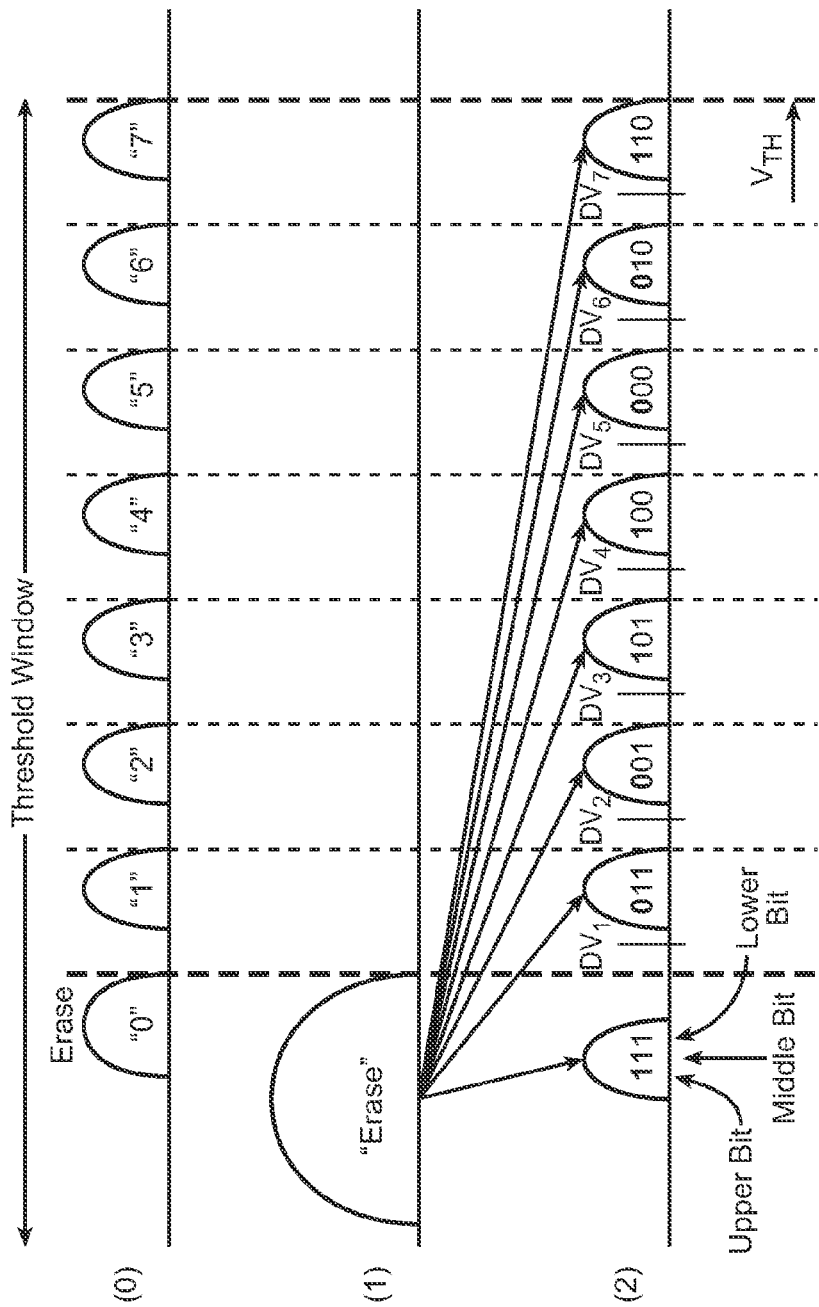
FIGS. 10(0)-10(2) illustrate an example of programming a population of 8-state memory cells.

FIGS. 10(0)-10(2) illustrate an example of programming a population of 8-state memory cells. FIG. 10(0) illustrates the population of memory cells programmable into eight distinct distributions of threshold voltages respectively representing memory states "0"-"7". FIG. 10(1) illustrates the initial distribution of "erased" threshold voltages for an erased memory. FIG. 10(2) illustrates an example of the memory after many of the memory cells have been programmed. Essentially, a cell initially has an "erased" threshold voltage and programming will move it to a higher value into one of the three zones demarcated by $DV_1$-$DV_7$. In this way, each memory cell can be programmed to one of the seven programmed state "1"-"7" or remain un-programmed in the "erased" state. As the memory gets more programming, the initial distribution of the "erased" state as shown in FIG. 10(1) will become narrower and the erased state is represented by the "0" state.

A 3-bit code having a lower bit and an upper bit can be used to represent each of the four memory states. For example, the "0", "1", "2", "3", "4", "5", "6" and "7" states are respectively represented by "111", "011", "001", "101", "100", "000", "010" and "110". The 3-bit data may be read from the memory by sensing in "full-sequence" mode where the three bits are sensed together by sensing relative to the read demarcation threshold values $DV_1$-$DV_7$ in seven sub-passes respectively.

Page or Word-Line Programming and Verify

One method of programming a page is full-sequence programming. All cells of the page are initially in an erased state. Thus, all cells of the page are programmed in parallel from the erased state towards their target states. Those memory cells with "1" state as a target state will be prohibited from further programming once they have been programmed to the "1" state while other memory cells with target states "2" or higher will be subject to further programming. Eventually, the memory cells with "2" as a target state will also be locked out from further programming. Similarly, with progressive programming pulses the cells with target states "3"—"7" are reached and locked out.

Figure 11:
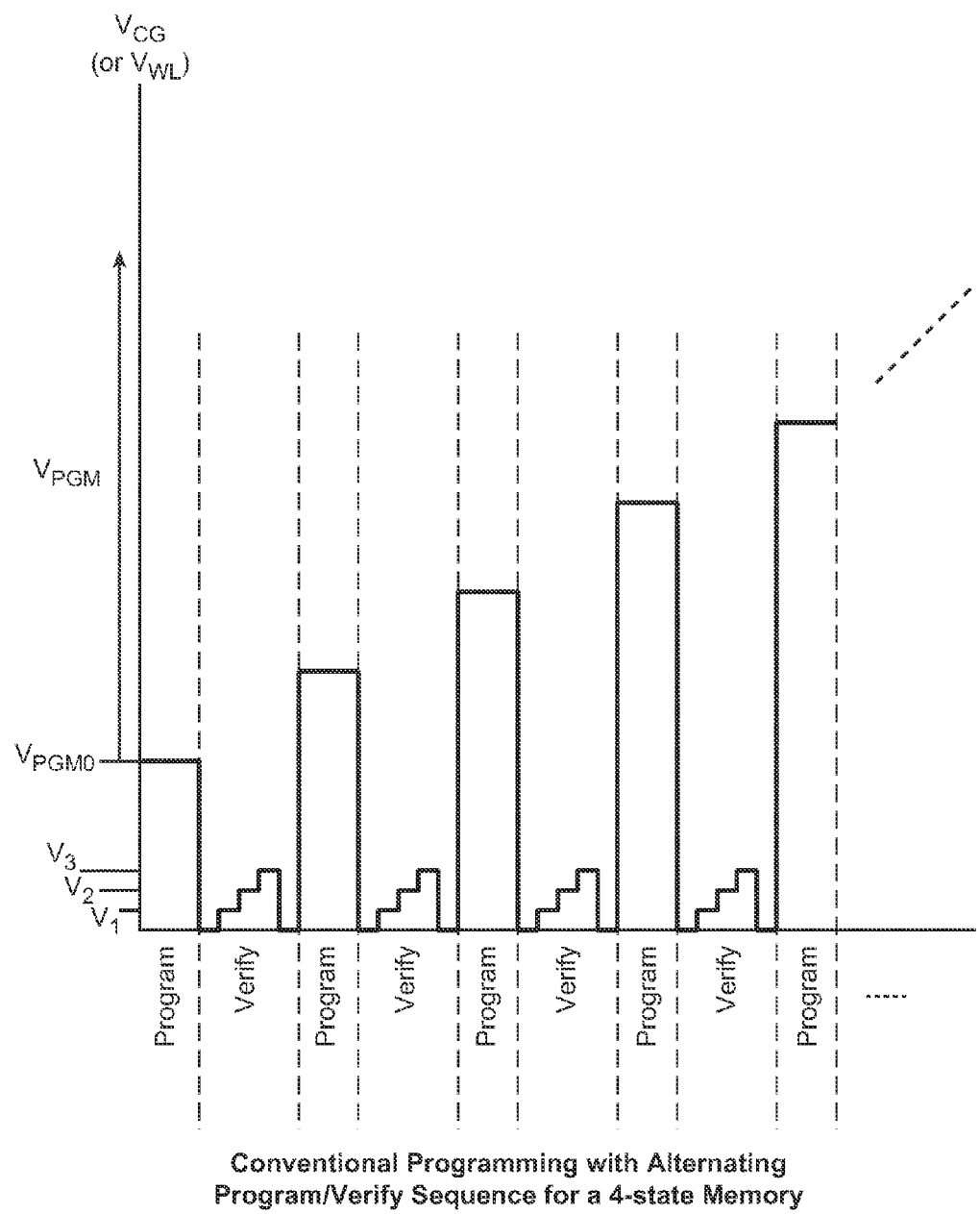
FIG. 11 illustrates a conventional technique for programming a 4-state memory cell to a target memory state.

FIG. 11 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified.

To accurately store data so that it can be read back, it needs to be programmed so that the distributions shown in FIGS. 9 and 10 are well defined. This requires that the programming waveform of FIG. 11 be accurate. If the memory experiences a power drop while programming, this can through off both the write pulse and verify values, so that the distributions will not be accurately written and properly resolved; and if the drop is undetected, the system could be unaware of this.

Immunity Against Temporary and Short Power Drops

The techniques of this section are targeted at protecting non-volatile memory circuits against temporary, short term power drops. Platforms and products (such as mobile handsets) that use non-volatile memory devices, such as flash memory cards, are general designed to meet a particular standard power specification. In actual operation, however, there may be occasions (usually rare) when the voltage supplied to the memory chip drops below the specified level. This can cause severe device failures, including the loss of data and, in some cases, even severe damage to the internal databases up to failure of storage device initialization. Even though the device is then being operated outside of the specified power levels, it would be beneficially if the device could still operate under these circumstances without these sorts of problems resulting.

Techniques for helping to avoid such drops are presented in U.S. provisional application No. 61/699,052; however, when the sort of Icc Index method presented there is not accurate enough, a backup plan should be implemented to detect Vcc drops. The mechanisms described here present a NAND memory that autonomously protects itself from temporary and short power drops by freezing its operation during the voltage drop. In the exemplary embodiment, when voltage detection circuitry on the memory circuit detects a sufficient voltage drop, a state machine on the memory circuit will be triggered to place the circuit into a suspended state. The voltage detection can be done by existing circuitry on the memory, or circuitry can be added for this purpose; for example, the supply voltage can be compared against a lower, internal reference voltage (such as derived from a band gap device) that is constant despite supply variations and is immune to temperature changes. In other embodiments, the detection could be performed by the controller, which would then send corresponding suspend and resume signals to the memory. Although more generally applicable, the following discussion will consider the main aspects in the context of a multi-state NAND flash memory whose specified operating voltage level (Vcc) is 3.0V. The protection mechanism works if the voltage drop is not too deep, where data latches and flip flops retain their values, but array operations like program/read/erase would fail. For example, although the memory may be functional down to only, say, 2.6V, data latches and flip flops in the peripheral NAND circuitry can retain their value until 1.8V. The power drop can be either external to the memory device, from the external supply level, or due to internal fluctuations, such as from other memory chips in the device drawing a lot of power. When the suspend is due to the amount of current inside the system being excessive, this suspend/resume function can help the system consume less power in this situation and even out power flows.

Thus, this is a different situation that when the memory system experiences a complete power loss in that the memory can resume where it left off once the Vcc voltage level to the chip stabilizes. In the case of a complete power loss, when the power is on again, the controller will perform an initialization sequence the same as in first power up. The flash management firmware is typically designed to overcome such events of sudden and unexpected power loss. In some flash management arrangements, the whole media will need to be scanned in order to rebuild the firmware's operating databases, while in other systems, only partial scanning necessary. In contrast, the sort of arrangement described in the following allows the memory to pick where it was frozen if the power drop is neither too long nor too deep. (The case of a complete power loss is discussed, for example, in US patent publication number US-2009-0089481-A1.)

Figure 12:
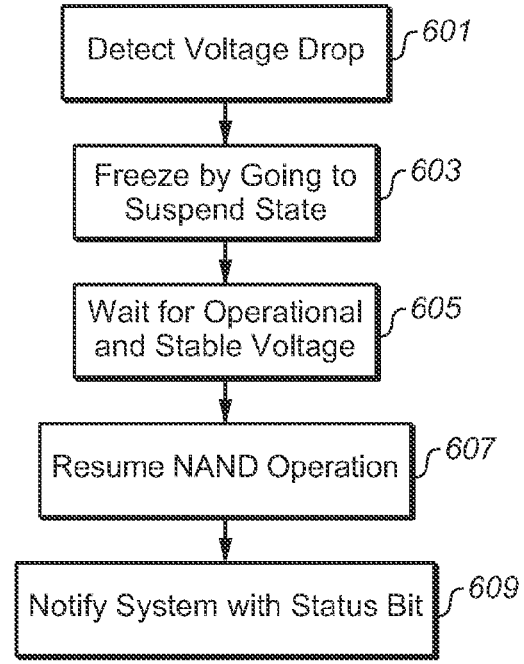
FIG. 12 is a flowchart illustrating a power drop protection mechanism.

Some of these aspects can be illustrated with respect to the exemplary flow of FIG. 12. At 601, the memory detects a voltage drop. In response, at 603 the memory freezes by going into the suspend state. The memory waits in this suspended state at 605 until the voltage level is at operational values and stable again, where at 607 operations are resumed where they left off. The memory can then notify the controller with a status bit at 609.

The detection mechanism looks for voltage drop below functional voltage for minimal period of time. Upon event of power drop, the suspend mechanism is activated. The NAND finished the last micro-operation (such as a programming or erase pulse, for example) and then freezes. The mechanics of the freeze can similar to that described in U.S. patent application Ser. No. 12/978,001, as far as finishing of a micro-operation and how the latches and so on are disposed, except that there the suspend and resume are in response to a manual command from the controller, where here the process is autonomously performed by the NAND circuit in response to the supply level. (In addition to the suspend/resume process as described in U.S. patent application Ser. No. 12/978,001, further detail on suspending programming operations can also be found in U.S. Pat. No. 7,206,230 and U.S. patent application Ser. No. 13/411,115.) More detail on how to suspend or slow operations are also given further below. When power is stable again, meaning above the functional voltage for predefined period of time, the NAND resumes the suspended operation until successfully finish. The NAND controller can be notified upon occurrence of such a voltage drop by polling a special status bit.

Figure 13:
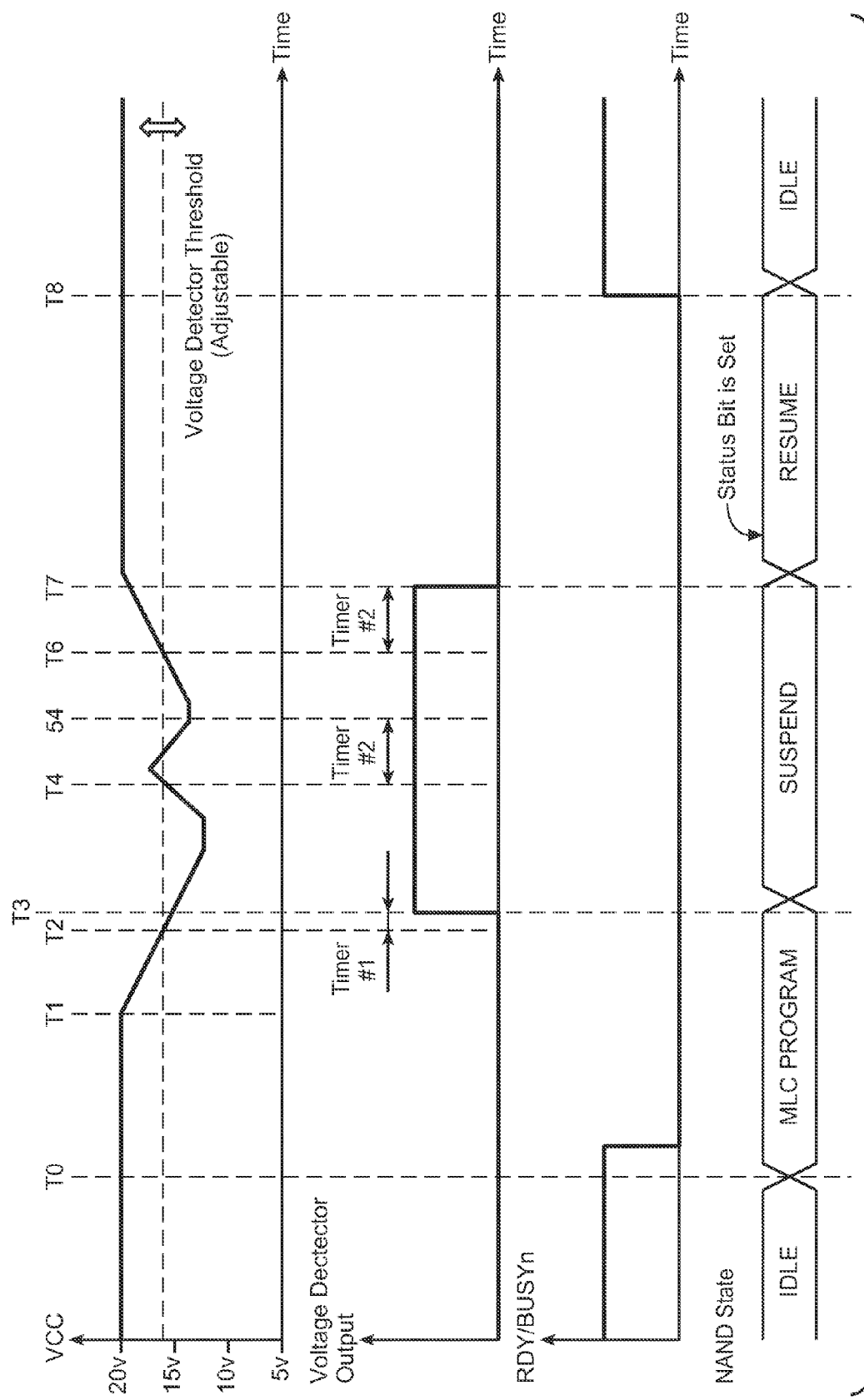
FIG. 13 illustrates the timing behavior of an exemplary embodiment of a power drop immunity mechanism.

FIG. 13 illustrates some details of the behavior of an exemplary embodiment for the mechanism in time domain. This specific example is for a multi-state (MLC) programming operation of a NAND memory, where the specified supply level (Vcc) is 3.0V. The Vec level is shown at top, where the voltage detector threshold for the suspend mechanism is taken at 2.6V. This threshold can be adjustable, based upon the specifics of the power specification, memory circuit requirements, and host behavior.

The second trace is for the output of the voltage detector, which is high when the memory is in the suspended state. Ignoring the time delays, the voltage detector output is high when the Vec value is below the detector's threshold value, and low when Vcc is above the threshold. A first time delay is introduced so that Vcc needs to be below the detector's value for some amount of time (determined by a Timer #1) before the detector output goes high, to avoid invoking the suspend for very transitory Vcc drops. A second delay (determined by a Timer #2 value) maintains the suspended state until the Vcc level is above the threshold long enough for this delay to elapse. This second delay is to allow for the voltage level to stabilize in the operating range before resuming the operation. The values of the Timer #1 and Timer #2 delays can also be trimmable, based upon the specifics of the power specification, memory circuit requirements, and host behavior.

The third waveform corresponds to a RDY/BUSY pin signal whereby the memory chip tells the controller whether or not it is in a ready state or busy. Once the memory chip begins an operation, here a program, it remains busy (RDY/BUSY low) during the operation, including during the suspend period to avoid confusion on the part of the controller. The bottom trace indicates the state of the memory circuit.

Initially, the NAND chip is idle, the RDY/BUSY signal is high, and Vcc is at the specified level. At T0, a command is issued, a MLC program in this example. The program operation begins and the RDY/BUSY indication goes low. At T1, VCC starts to drop, the voltage crossing below the threshold at T2. In order to prevent false alarms, the Timer #1 is activated until T3 (such as 10 us, for example). At T3, Vcc is still below the threshold and the voltage detector trips the suspend mechanism, the NAND finishes the last micro-command (such as a programming pulse) and goes into the suspend state (or, more accurately, issues a command for the suspend state). At T4, Vcc rises above threshold but it is not stable, having dropped back below the threshold level before the Timer #2 elapses at T5. The voltage detector rules it out and keeps the suspend request. At T6, VCC is above threshold again. AT T7, when Timer #2 lapses, the voltage is examined during the period between T6 and T7 and it is above threshold and a resume command can be issued. The value of Timer #2 will typically be longer than the value for Timer #1, in order be confident that the voltage has stabilized: for example, if Timer #1 is 10 us, then Timer #2 would be taken at, say, 100 us. The voltage detector deactivates its output and the NAND resumes its operation. The status bit can be latched and be cleared afterward. At T8, the MLC program is finished successfully with power failure status bit turned on, the RDY/BUSY level returns to high, and the NAND chip is idle.

In a memory system with multiple memory die that are suspended, if all of the die wake up at the same time, this again cause a problematic power drop. To prevent this, the resume can be staggered, such as by introducing some randomness or other techniques. For example, randomness could be introduced by using {some bits of block address, some bits of page address}×100 ns, or by use of a random number generator.

The exemplary embodiment can be based on the latch structures described in the preceding sections and further developed in U.S. patent application Ser. No. 12/978,001. In this case, the described suspend mode does not require additional data latches, so that the increase in complexity is relatively minimal. As described above, however, for the exemplary embodiment the process is autonomously performed by the NAND circuit in response to the supply level, rather than a manual suspend as issued by the host. The voltage drop can be determined by a detector specifically for this purpose or else other voltage detectors on the memory can be used, since there is typically such circuitry already on the memory as part of the circuit's analog circuitry. The values for the voltage detection threshold, Timer #1, and Timer #2 can all be trimmable, with the values determined based on the device and system characteristics and set along with other operating parameters in ROM fuses, for example. In other embodiments, these values can be altered by the controller during initialization or updated subsequently during operation.

It should also again be noted that the sort of suspend described above, such as between T3 and T7 of FIG. 13, freezes the system in place, so that the suspended operation can take up where it left off once power is stabilized in the operating range. This sort or arrangement is thus different from the sort of Write Protect (WP) signal that is sometimes found on memory devices and which is equivalent to a soft reset. In the case when a WP signal is asserted, this will begin to stop the memory circuit's state machines and discharge the voltages gracefully. Thus, in contrast to the above, such a soft reset will abort existing operations on the memory, leaving them unfinished. For example, in the case of a program operation, this would mean that the last written page is not trustworthy, meaning that the whole of the block would need to be erased and rewritten to issue the integrity of the data. In some types of flash memory management system, this problem can be magnified: if there is no indication of the block on which the memory was operating before the soft reset, then the whole pool of blocks involved is suspect and needs to be replaced, resulting in a fairly messy cleanup operation to recover.

In contrast, by being able to freeze the memory circuit during the existing operation before it lapses into a danger zone, if the power drop is not too long or deep, the memory is able to successfully continue the suspended operation once power resumes and is stabilized. This sort mechanism can be particularly useful not only when the power drop is due to the external supply from a host, but also protects the individual memory chips inside a memory system from internal fluctuations due to power consumption variations inside the memory system.

Pausing Mechanisms

This section considers some mechanisms for pausing the memory's operation in case a Vcc drop is detected. More specifically, it considers slowing or pausing memory operations using on-chip clock signals: for example, in some operations, these can just be suspended with a clock pause; in other cases, a charge pump can work at a lower pumping frequency; or the state machine does not fully stop, but pauses at certain states. This sort of arrangement differs from what is found in the references cited above in that it can suspend at a smaller granularity (sub-phases of commands), rather than suspending at transition boundaries. The suspend does need logic requirements to parameters as in the case of a logic managed suspend. Although the preceding section considered the case where the suspend was issued from within the memory chip based on a drop in the supply level due to the too much current Icc being drawn, the techniques of this section can also be used when the suspend is externally generated, such as from a controller or host. More detail on this subject, and also more generally on the structures involved here, can be found in U.S. Pat. No. 7,206,230; US patent publication number US-2009-0089481-A1; and in the following U.S. patent application Ser. Nos. 12/978,001; 13/411,115; 13/471,198; and 13/559,377.

Figure 14:
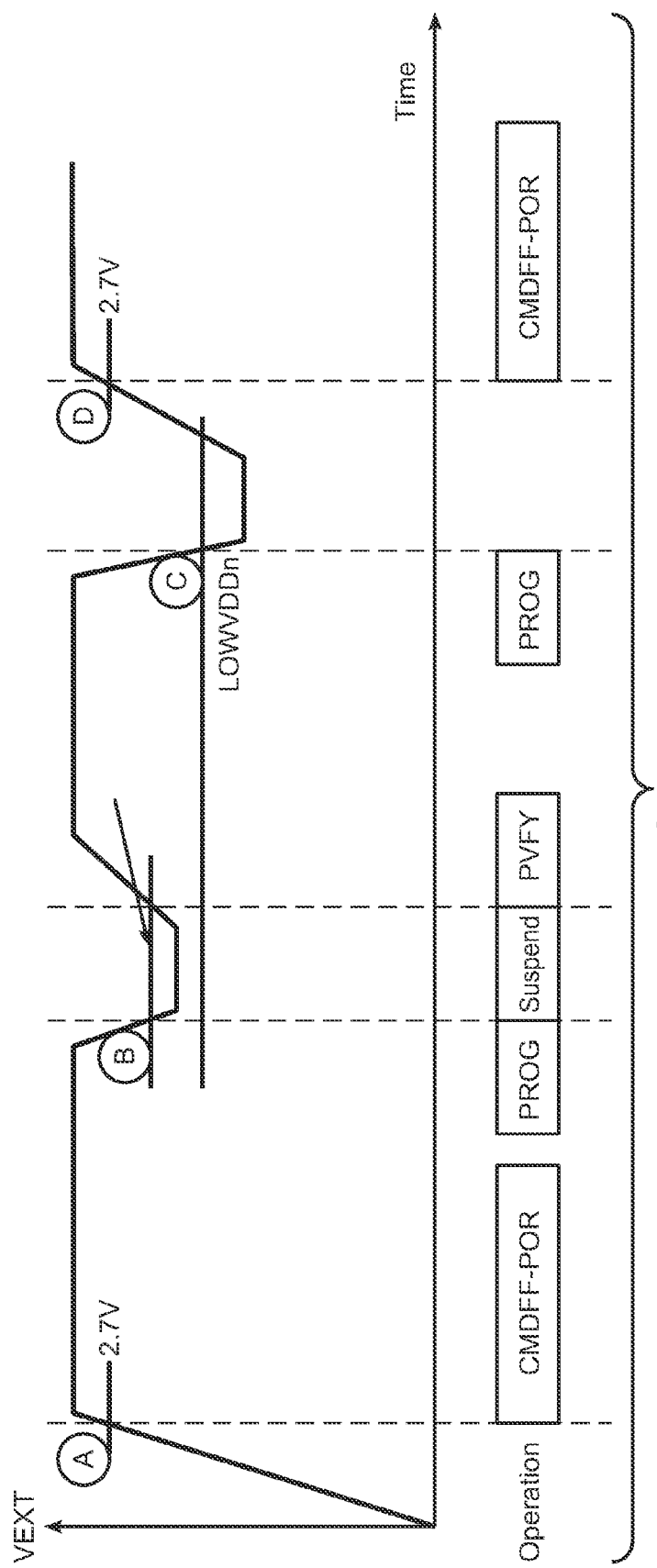
FIG. 14 illustrates pausing between sub-phases of an operation.

FIG. 14 can be used to illustrate some of the aspects of this section, again in the context of a programming command as in FIG. 13. (Here, the focus in on the sub-phases of the programming operation, rather than on the delay, so the delays are not indicated in FIG. 14; also, this helps to show that the aspects of this section can be used independently of the delay aspect.) At A, the voltage level VEXT powers up and reaches the level (here 2.7V) at which operation can begin or be resumed and a command (CMD-POR) is issued for a "power on read" (POR), where the chip reads the ROM fuse data and downloads the data to registers. A program operation (PROG) phase of a write operation then begins, during which VEXT drops low enough at point B to trigger a suspend. Once VEXT comes back up sufficiently, the write operation continues with a program verify (PVFY) operation, which is then followed by the next program pulse PROG. During this second PROG operation, the VEXT level drops again, this time dropping below the level LOWVDDn (at C) that triggers a hard abort.

Because of the hard abort, where the power again comes back up sufficiently at D, a power on read (POR) is again needed.

FIG. 15 looks at one method of dealing with power fluctuation such as may occur during operations such as read, program verify or programming. The top line shows the Vcc level, where this drops for a period before rising back up. Here the droop is enough to trigger a suspend, but not a hard abort. This triggers the Vcc_low_detect signal of the second line. (Again, when the aspects of the preceding section are included, there would be the appropriate delays.) When the Vcc voltage drops, the voltage detector on the memory circuit will detect the level, where the detection speed here is <500 ns, and the signal Vcc_low_detect can be triggered. Below are shown the state machine clock trace TMOSC for two different alignments relative to the Vcc_low_detect signal. A modified TMOSC can be generated in sync with original TMOSC and can depend on the voltage level. This is shown below the two TMOSC traces: in the first, where TMOSC is already high, it stays high; in the second, once TMOSC goes high, it remains high. In both cases, once Vcc_low_detect goes low, the modified TMOSC starts again the first time the original TMOSC goes low. With the modified TMOSC, many state machine operations can be paused by the clock, being resumed when the Vcc rises up.

Figure 16A:
FIGS. 16A and 16B respectively represent sub-phases of a write and a read operation.
Figure 16B:
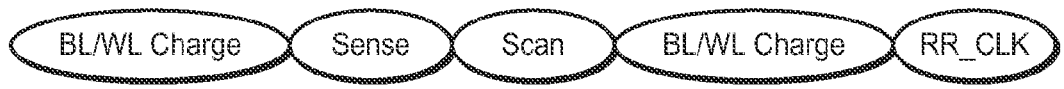

FIGS. 16A and 16B schematically respectively illustrate how operations can be elongated during writing and sensing. FIG. 16A looks at the sequence for some of the sub-phases related to the program pulse. The bit line inhibit sub-phase (BL inhibit) and scan time (when data is transferred between latches) can be paused with the modified clocks; however, the following sub-phase when the cells are programmed by a high voltage program pulse (PD_CLK/BSCAN, where BSCAN is a bit scan where failure bits are counted) cannot readily be PAUSED. As for the following sub-phase (PR_CLK) during with word lines are allowed to discharge, as this draws no real current, there is no need for it to be stopped. The state transitions from program to program verify to lockout can be paused.

FIG. 16B looks at the sequence for sub-phases of a sensing operation. The bit line and word line charging time (BL/WL charge) and scan time can be paused. The sense time and time to discharge word line (RR_CLK) do not need to be paused as these produce no real current draws. State transitions from one read to another read can be paused. If there is power drop during a read, the read result could be wrong, but an elongated bit line, word line charging time with a paused clock can overcome this issue.

Considering these in more detail, during the time to program the cells with high voltage, the main state machine clock (TMOSC) cannot readily be paused, although the charge pump clock can be paused to reduce the Icc draw. Also during the time to program the cells with high voltage, the detection should be stopped and generate a fail status. Sensing time segments when capacitors are being discharge should not be paused or stopped, but data transfers between latches of the sensing circuits can be paused. During word line or bit line pre-charge times, both the state machine clock and charge pump clocks can be paused.

Conclusion

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

It is claimed:

1. A method of operating a non-volatile memory circuit connected to receive a supply voltage for use in operations performed therein, the method comprising:
   monitoring by the memory circuit of the voltage level of the voltage supply;
   while monitoring the voltage level of the voltage supply, determining whether the voltage level of the supply voltage has dropped below a first voltage level for a first amount of time;
   in response to determining that the voltage level has dropped below the first voltage level for the first amount of time, issuing a command to place an operation on the memory circuit into a suspended state;
   subsequently continuing to monitor by the memory circuit of the voltage level of the voltage supply;
   while the operation on the memory circuit is in a suspended state, determining whether the voltage level of the supply voltage risen above a second voltage level for a second amount of time;
   in response to determining that the voltage level has risen above the second voltage level for the second amount of time, issuing a command to resume the operation placed in a suspended state; and
   completing the resumed operation.

2. The method of claim 1, wherein the first voltage level is trimmable.

3. The method of claim 1, wherein the second voltage level is trimmable.

4. The method of claim 1, wherein the first and second voltage levels are the same.

5. The method of claim 1, wherein the duration of the first amount of time is trimmable.

6. The method of claim 1, wherein the duration of the second amount of time is trimmable.

7. The method of claim 1, wherein the memory circuit is part of a non-volatile memory system comprising a controller circuit and the memory circuit, the method further comprising:
   in response to placing the operation in a suspended state, sending an indication thereof from the memory circuit to the controller circuit.

8. The method of claim 1, wherein the memory circuit is part of a non-volatile memory system comprising a controller circuit, the memory circuit and one or more additional memory circuits, wherein the method is performed on the memory circuit independently of the controller circuit and the additional memory circuits.

9. The method of claim 1, wherein the operation comprises a plurality of micro-operations and placing the operation into a suspended state includes completing a micro-operation currently in progress prior to the operation being suspended.

10. The method of claim 9, wherein the operation is a programming operation and the plurality of micro-operations include a plurality of programming pulses, where a currently being executed programming pulse is completed prior to the programming operation being suspended.

11. The method of claim 1, wherein the command includes multiple sub-phases and, in response to the command to place an operation in a suspended state, determining whether the sub-phase being executed is suspendable and, if not, waiting until the operation enters a suspendable sub-phase or ends before executing the suspended state.

12. The method of claim 1, wherein the command to resume the operation placed in a suspended state is generated by the controller and includes a parameter dependent delay.

13. The method of claim 12, wherein the parameter values includes a degree of randomness.

14. The method of claim 1, wherein the non-volatile circuit is part of a memory system including one or more additional non-volatile memory circuits, the method further comprising:
in response to said determining that the voltage level has dropped below the first voltage level for the first amount of time, issuing a command to place an operation on one or more of the additional memory circuits into a suspended state; and
in response to said determining that the voltage level has risen above the second voltage level for the second amount of time, issuing a command to resume the operation of the additional memory circuits placed in a suspended state,
wherein the commands to resume the operations placed in a suspended state on the different ones of the memory circuits are issued staggered in time with respect to each other.

15. The method of claim 14, wherein the amount stager on the different one of the memory circuits is parameter dependent.

16. The method of claim 15, wherein the parameter values includes a degree of randomness.

17. The method of claim 1, wherein the suspended state includes altering a clock signal on the memory circuit.

18. The method of claim 17, where the suspended state includes pausing a clock signal on the memory circuit.

19. The method of claim 17, where the suspended state includes running a clock signal on the memory circuit at a lower frequency.

20. The method of claim 17, where the clock signal is a state machine clock.

21. The method of claim 17, where the clock signal is a charge pump clock.

* * * * *